United States Patent [19]

Suzuki

[11] Patent Number: 4,947,172
[45] Date of Patent: Aug. 7, 1990

[54] DIGITAL-TO-ANALOG CONVERSION CIRCUIT

[75] Inventor: Kaoru Suzuki, Tochigi, Japan

[73] Assignee: Kabushiki Kaisha Toshiba, Kawasaki, Japan

[21] Appl. No.: 373,659

[22] Filed: Jun. 28, 1989

Related U.S. Application Data

[63] Continuation of Ser. No. 63,215, Jun. 17, 1987, abandoned.

[30] Foreign Application Priority Data

Jun. 25, 1986 [JP] Japan ............................... 61-147147

[51] Int. Cl.⁵ .............................................. H03M 1/68
[52] U.S. Cl. ...................................... 341/145; 341/118
[58] Field of Search ........................ 341/118, 120, 145

[56] References Cited

U.S. PATENT DOCUMENTS 4,070,665  1/1978  Glennon et al. ............. 340/347 CC
4,340,882  7/1982  Maio et al. ................... 340/347 CC
4,465,996  8/1984  Boyacigiller et al. ........ 340/347 DA Primary Examiner—William M. Shoop, Jr.
Assistant Examiner—Marc S. Hoff
Attorney, Agent, or Firm—Cushman, Darby & Cushman

[57] ABSTRACT

A digital/analog conversion circuit including plurality of digital/analog converters, a signal synthesizing circuit and a data converting section. The digital/analog converters convert their digital data to corresponding analog signals. The signal synthesizing circuit additively synthesizes respective outputs of the digital/analog converters in a predetermined synthesizing ratio. The data coverting section is provided at an input side of at least one of the digital/analog converters to convert input digital data to data for correcting errors emerging from the output of the signal synthesizing means due to errors among the digital/analog converters and to supply the correcting data to the following digital/analog converter.

5 Claims, 8 Drawing Sheets

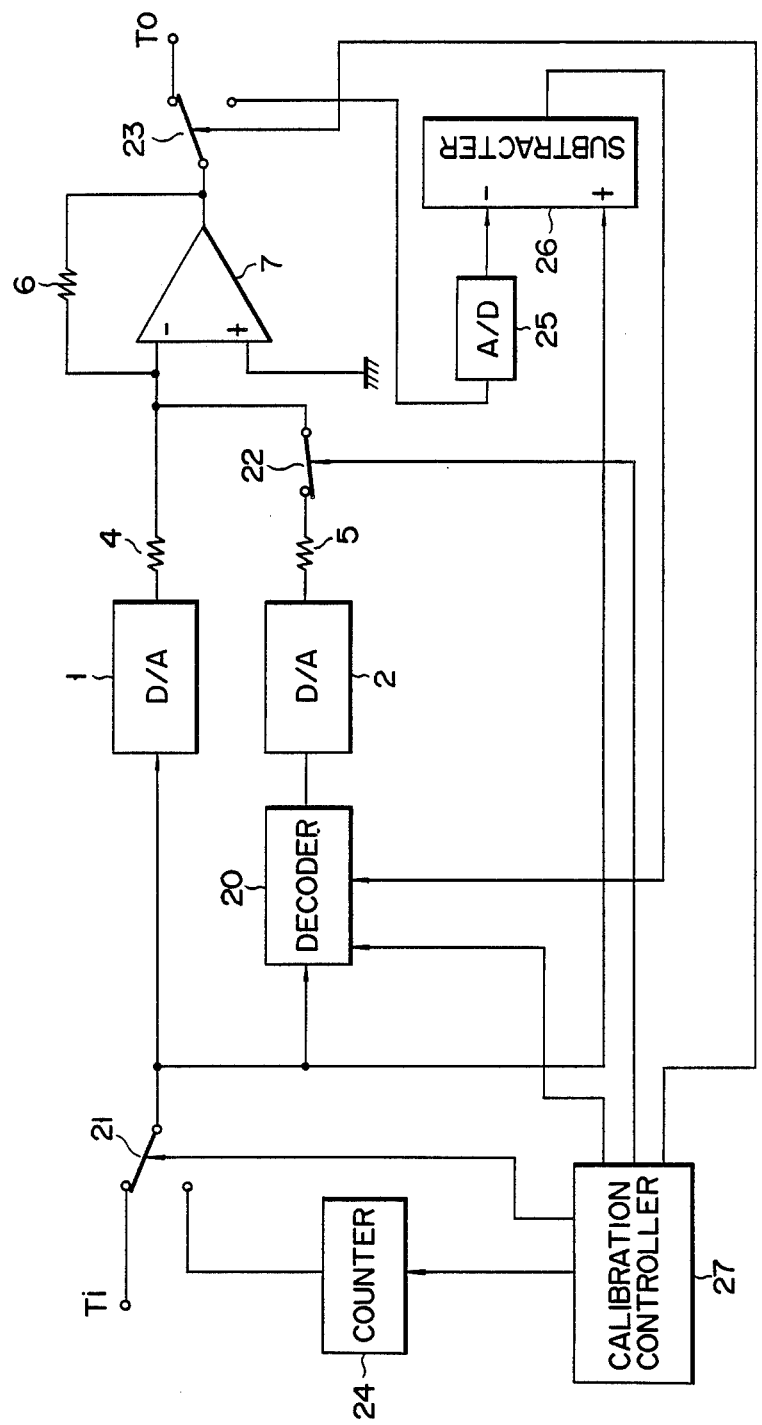
F I G. 9

DIGITAL-TO-ANALOG CONVERSION CIRCUIT

This is a continuation of application Ser. No. 063,215, filed June 17, 1987, now abandoned.

BACKGROUND OF THE INVENTION

This invention relates to a digital-to-analog (D/A) conversion circuit constructed a plurality of D/A converters.

FIGS. 1, 2 and 3 show three conventional converters for converting a digital signal to an analog signal.

The D/A converter as shown in FIG. 1 is called a weighted resistor type D/A converter. Between constant voltage source 10 and summing amplifier 12 are connected an n number of weighted parallel resistors having resistive values 2R, 4R, 8R, 16R ... $2^n$R corresponding to bits B1, B2, B3, B4 ... Bn of input digital data. Between the parallel array of the weighted resistors and constant voltage source 10, switches SW1, SW2, SW3, SW4 ... SWn are connected in series with the weighted resistors 2R, 4R, 8R, 16R ... $2^n$R, respectively. Switches SW1, SW2, SW3, SW4 ... SWn, upon receipt of the corresponding bits "1" of the input data, allow the corresponding resistors to be connected to constant voltage source 10 and, upon receipt of the corresponding bits "0" of the input data, allow the corresponding resistors to be connected to a common potential through a break of the connection between the resistors and constant voltage source 10.

The D/A converter as shown in FIG. 2 is called a ladder resistor type D/A converter. Between constant voltage source 10 and summing amplifier 12 are connected an n number of parallel resistors having the same resistive values 2R, 2R, 2R, ..., 2R corresponding to respective bits B1, B2, B3, ... Bn of input data, and between the parallel resistors are connected an n−1 number of resistors R having the same resistive values R. In this way, a the R-2R type ladder circuit is formed in which switches SW1, SW2, SW3, ... SWn are connected in series with the corresponding resistors (2R, 2R, 2R, ..., 2R). Switches SW1, SW2, SW3 ... SWn, upon receipt of the corresponding bits "1" of the input data, allow the corresponding resistors to be connected to constant voltage source 10 and, upon receipt of the corresponding bits "0" of the input data, allow the corresponding resistors to be coupled to a common potential through a break of the connection between the resistors and constant voltage source 10. Resistors 2R are connected between the common potential level and a junction connected between the resistors (2R) corresponding to an LSB (least significant bit) and the adjacent resistor R.

A D/A converter as shown in FIG. 3 is called "a weighted constant current type D/A converter". Between power source 14 and summing amplifier 12 is connected a parallel array of weighted constant current sources I/2, I/4, I/8, I/16 ... I/$2^n$ corresponding to respective bits B1, B2, B3, B4 of input data with switches SW1, SW2, SW3 ... SWn connected in series with constant current sources I/2, I/4, I8, I/16 ... I/$2^n$.

In these D/A converters, shown in FIGS. 1 to 3, when any of these switches are turned ON and receive the bits "1" of the input data, then an analog signal corresponding to the bit "1" positions of the input data, that is, an analog signal corresponding to the input data, is output as a voltage $V_O$.

In these conventional D/A converters, the accuracy of the output analog signal with respect to the digital input signal is influenced by the accuracy of the resistors or the constant current sources. In order to obtain an analog output signal of high precision, it is necessary to employ resistors of uniform accuracy. However, it is difficult to prepare a large number of resistors of identical precision and, even if it could be attained, the manufacturing cost would become high. It is also difficult to construct a large number of constant current supplies of uniform accuracy.

Thus, in the conventional D/A converter there is a tradeoff between the high precision of the component parts involved and a high manufacturing cost.

SUMMARY OF THE INVENTION

It is accordingly the object of this invention to provide a high-precision digital-to-analog conversion circuit using a combination of a plurality of low-precision D/A converters.

According to this invention, there is provided a digital-to-analog conversion circuit comprising a plurality of D/A converters in a parallel array, a summing amplifier section for additively synthesizing respective outputs of the plurality of D/A converters in a predetermined ratio, and a decoder inserted at an input side of at least one of the plurality of D/A converters to supply to the D/A converter with a value which contains components for correcting an error of a final D/A conversion output from the summing amplifier in accordance with the input digital value.

In such a digital-to-analog conversion circuit, a plurality of relatively low-accuracy D/A converters have their outputs synthesized at the summing amplifier, and these D/A converters include a D/A converter for receiving a digital value containing components for correcting the extent of their final accuracy. It is, therefore, possible to obtain a D/A conversion output of high accuracy.

According to this invention, a high-accuracy digital-to-analog conversion circuit can readily be implemented at lower costs with the use of a proper combination of D/A converters of a lower accuracy.

BRIEF DESCRIPTION OF THE DRAWINGS

FIG. 9 is a block diagram showing a digital-to-analog conversion circuit according to a third embodiment of this invention.

DETAILED DESCRIPTION OF THE PREFERRED EMBODIMENTS

Figure 1:
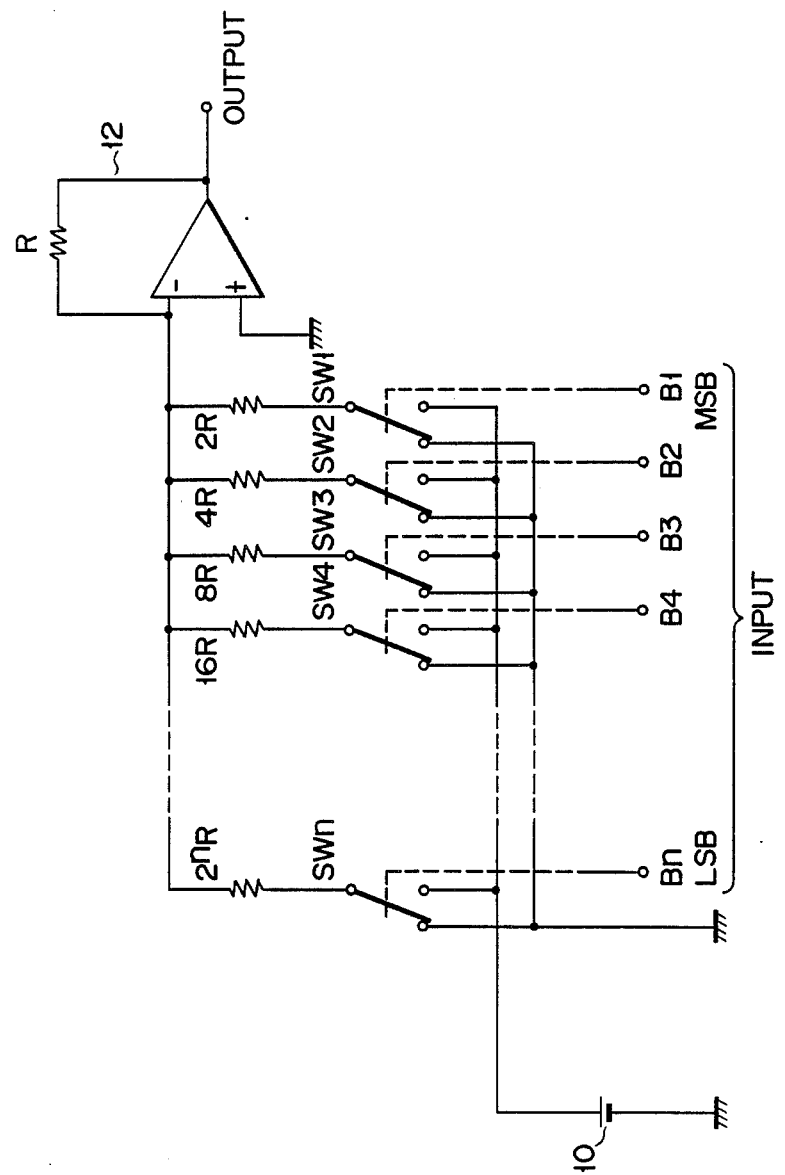
FIGS. 1 to 3 are circuit diagrams each showing an arrangement of a conventional D/A converter.
Figure 2:
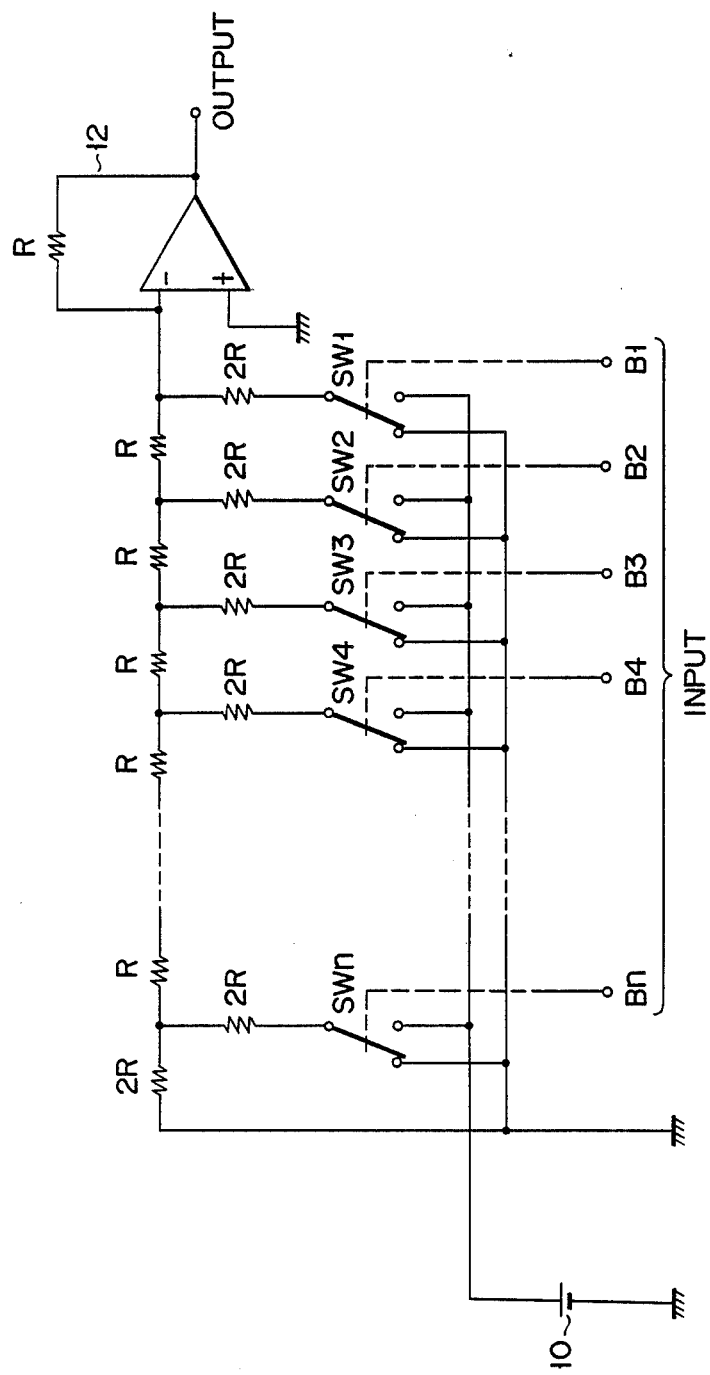
Figure 3:
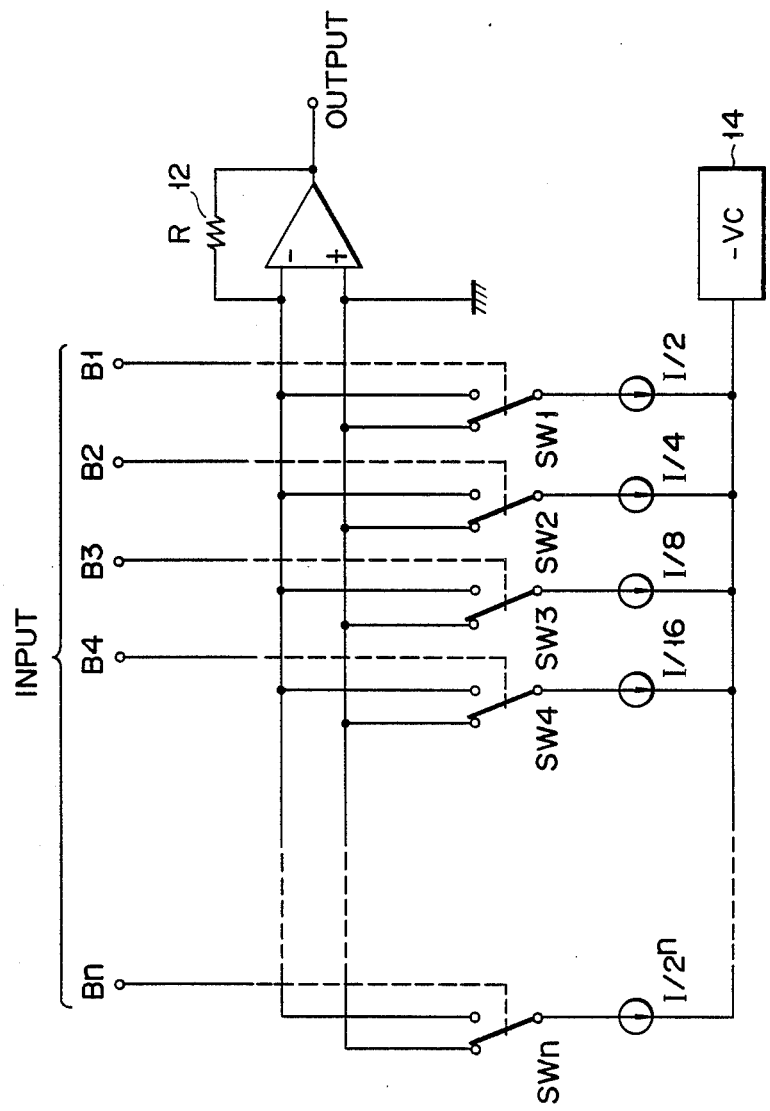
Figure 4:
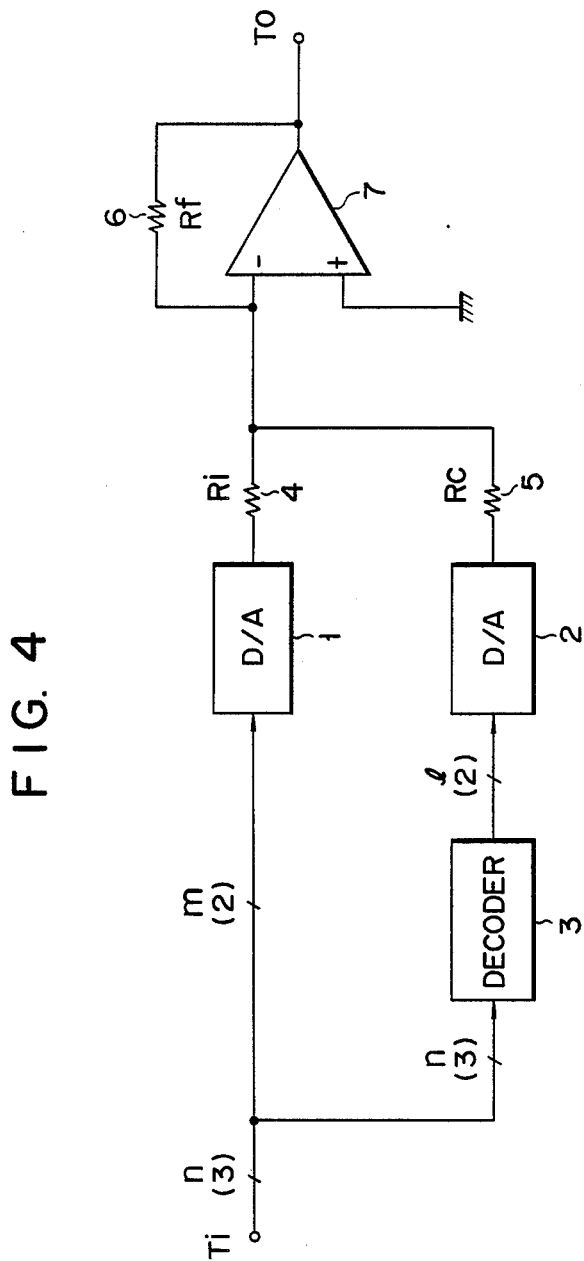
FIG. 4 is a block diagram showing a digital-to-analog conversion circuit according to a first embodiment of this invention.

FIG. 4 is a block diagram showing a digital-to-analog conversion circuit according to a first embodiment of this invention. The digital-to-analog conversion circuit comprises first and second D/A converters 1 and 2, decoder 3, resistors 4, 5 and 6, and summing amplifier 7. In this arrangement, a digital signal is supplied to input terminal Ti and an analog signal is output from output terminal To.

First D/A converter 1 is of a voltage-output, single-polarity D/A type having, for example, a 2-bit resolution, and is of a relatively low accuracy type having an error tolerance within a range of $\pm\frac{1}{2}$ of the least significant bit (LSB). In this embodiment, use is made, as first D/A converter 1, of such a type as to obtain a voltage output of a negative polarity. First D/A converter 1 has the input/output characteristics as shown in Table 1.

TABLE 1

| Input Digital Value | Ideal Value | Error | Output Value |
|---|---|---|---|
| 00 | 0.0 V | 0.0 V | 0.0 V |
| 01 | −1.0 V | +0.5 V | −0.5 V |
| 10 | −2.0 V | −0.5 V | −2.5 V |
| 11 | −3.0 V | +0.2 V | −2.8 V |

Figure 5:
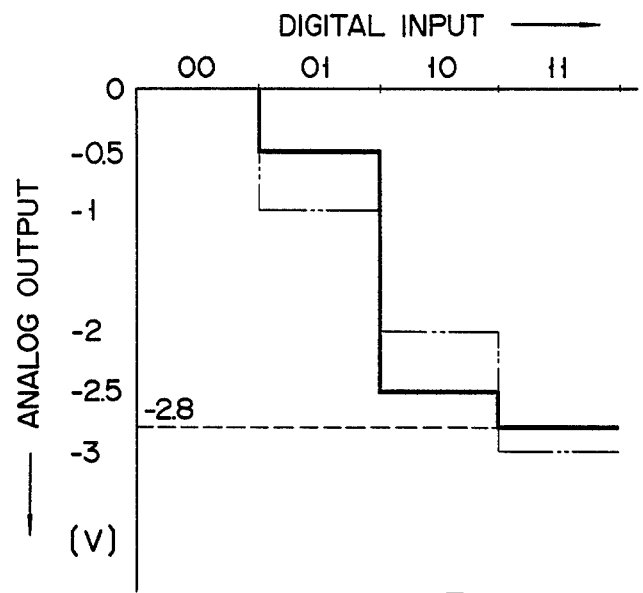
FIGS. 5 and 6 are graphs showing the conversion characteristics of first and second D/A converters of the embodiment of FIG. 4.

The conversion characteristics of Table 1 are as shown in FIG. 5 where the two-dots-dash lines denote the ideal characteristic and the solid lines denote the actual characteristic containing errors.

Second D/A converter 2 is of a voltage-output, bipolar type having, for example, a 2-bit resolution. Second D/A converter 2 is connected in parallel with first D/A converter 1. It is assumed that in this embodiment an error-free, ideal D/A conversion is performed, for convenience in explanation. Second D/A converter 2 has therefore an ideal input/output characteristic as shown in Table 2, noting that it has an error tolerance of, for example, $\pm\frac{1}{2}$ of the LSB in the actual circuit.

TABLE 2

| Input Digital Value | Output Value (Ideal Value) |
|---|---|
| 00 | 0.0 V |
| 01 | 1.0 V |
| 10 | −2.0 V |
| 11 | −1.0 V |

Figure 6:
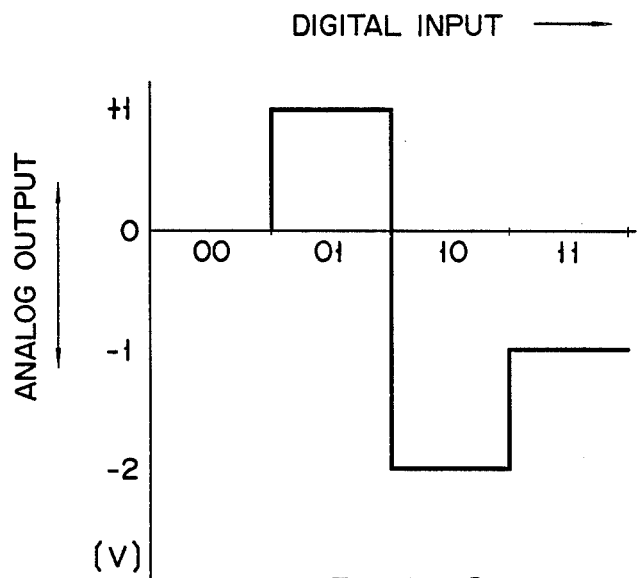

The conversion characteristic of Table 2 is as shown in FIG. 6.

Figure 7:
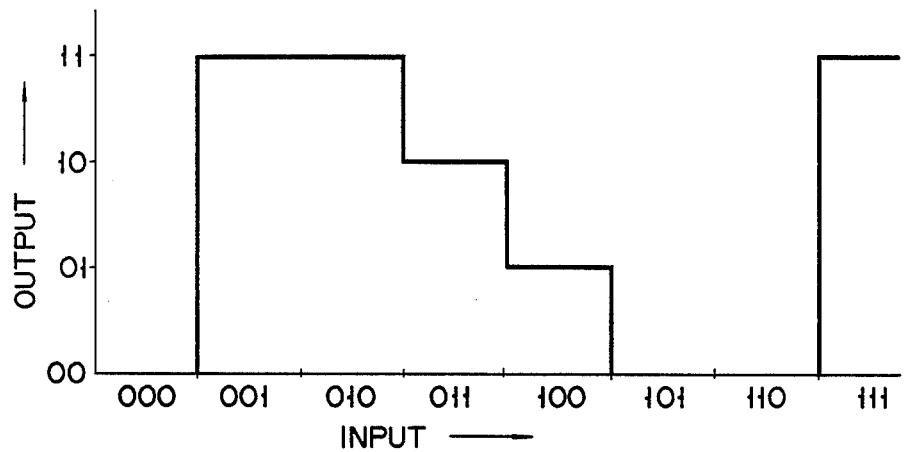
FIG. 7 is a graph showing the characteristic of a decoder of the embodiment of FIG. 4.

In order to digitally correct the final output accuracy of the D/A conversion circuit as shown in 4, decoder 3 is connected in series with the input side of second D/A converter 2. Decoder 3 is adapted to convert a three-bit digital value to a two-bit digital value. The input/output characteristic of decoder 3 is shown in Table 3 and illustrated in FIG. 7.

TABLE 3

| Input Digital Value | Output Digital Value |
|---|---|
| 000 | 00 |
| 001 | 11 |
| 010 | 11 |
| 011 | 10 |
| 100 | 01 |
| 101 | 00 |
| 110 | 00 |
| 111 | 11 |

The digital value, which is output from decoder 3, is supplied to second D/A converter 2.

Input terminal Ti is connected to the input terminals of first D/A converter 1 and decoder 3, and the output terminal of decoder 3 is connected to the input terminal of second D/A converter 2 in which case an input signal is supplied as a three-bit digital signal to input terminal Ti. First D/A converter 1 converts the upper two bits of the three-bit input data to an analog signal. The input signal is supplied, as a three-bit signal, directly to decoder 3, and the two-bit output data of decoder 3 is converted, by second D/A converter 2, to an analog signal.

The output of first D/A converter 1 is supplied through resistor 4 to the inverting input terminal of summing amplifier 7, and the output of second D/A converter 2 is supplied through resistor 5 to the inverting input terminal of summing amplifier 7. The noninverting input terminal of summing amplifier 7 is grounded. Summing amplifier 7 thus arranged acts as an inverting amplifier. Resistor 6 is of a feedback type, whereby the output of summing amplifier 7 is fed back to the inverting input terminal of amplifier 7. The output terminal of summing amplifier 7 is delivered to output To. In this case, the resistive value Ri of input resistor 4 for summing amplifier 7 is selected to be $$Rc \times \{1/(2^{n-m})\}$$

where Rc denotes a resistive value of input resistor 5 and where the bit number of the input digital data supplied to input terminal Ti is set to be n-bits, the resolution of the first D/A converter 1 being set to be m-bits and the resolution of second D/A converter 2 being set to be l-bits. Because l=m=2 and n=3 in this embodiment, a ratio among the resistive values Ri, Rc and Rf of resistors 4, 5 and 6 is set to be $$Ri:Rc:Rf=(\tfrac{1}{2}):1:1,$$

provided that the ratio between Rc and Rf is 1:1.

The gain G1 of an amplifying circuit with respect to the output of first D/A converter 1 becomes $$-2(=Rf/Ri),$$

noting that the aforementioned amplifying circuit is comprised of input resistors 4 and 5, feedback resistor 6 and the summing amplifier. The gain G2 of the amplifying circuit with respect to the output of second D/A converter 2 becomes $$-1(=Rf/Rc).$$

Thus, the three-bit digital-to-analog conversion circuit having an input/output characteristic as shown in Table 4 is implemented by a combination of D/A converters 1 and 2 and decoder 3.

TABLE 4

| | First D/A | | Second D/A | Final Output |
|---|---|---|---|---|
| Input | output | α | β | α + β |
| 000 | 0.0 V | 0.0 V | 0.0 V | 0.0 V |
| 001 | " | " | 1.0 V | 1.0 V |
| 010 | −0.5 V | 1.0 V | 1.0 V | 2.0 V |
| 011 | " | " | 2.0 V | 3.0 V |
| 100 | −2.5 V | 5.0 V | −1.0 V | 4.0 V |
| 101 | " | " | 0.0 V | 5.0 V |
| 110 | −2.8 V | 5.6 V | 0.0 V | 5.6 V |
| 111 | " | " | 1.0 V | 6.6 V |

In Table-4, α=(−2)×(output of first D/A converter 1), an dβ=(−1)×(output of second D/A converter 2).

The upper two bits alone of the three-bit input digital value are supplied to first D/A converter 1 of a single-polarity type. D/A converter 1 delivers an output value as shown in Table 1, and the output of D/A converter 2 of a bipolar type is inversion-amplified and becomes −2 times greater. The three-bit digital value which has been input to decoder 3 delivers an output, as a value as shown in Table 3, to second D/A converter 2 of a bipolar type where it is converted. The outputs of first and second D/A converters 1 and 2 are supplied to summing amplifier 7 where they are amplified and, simultaneously, added together. As a result, an analog output as shown in Table 4 is obtained from summing amplifier 7.

With second D/A converter 2 and decoder 3 eliminated from the circuit of FIG. 4, the data conversion characteristic of decoder 3 is determined based on the difference between the output value of the output terminal To, when various digital values are input to the input terminal Ti, and an ideal value, and the gain of amplifier 7 is determined by the resistive values Rc and Rf of resistors 5 and 6. With the error of D/A converter 1 and gain of amplifier 7 both set to be constant, use may be made of a decoder of a constant conversion characteristic using, for example, a ROM (read only memory). If, on the other hand, the error of D/A converter 1 and gain of amplifier 7 change with time, then an update-enabling decoder may be used as decoder 3 in combination with, for example, a RAM (random access memory) to have its conversion characteristic updated so that the data conversion characteristic of decoder 3 may be corrected for each predetermined time period.

In this embodiment, the ratio of the resistive values of resistors 4, 5 and 6 is set to be $$Ri:Rc:Rf=1/(2^{l-1}):1:1$$

in which case it is possible to provide a digital-to-analog conversion circuit of an (m+1−1)-bit resolution.

With the allowable error of single-polarity D/A converter 1 set to be within a range of ±1 LSB, the ratio of the resistive values of resistors 4, 5 and 6 is set to be $$Ri:Rc:Rf=1/(2^{l-2}):1:1$$

in which case it is possible to provide a digital-to-analog conversion circuit of an (m+ =1−2)-bit resolution.

A high-resolution type digital-to-analog conversion circuit can be implemented with the use of three or more D/A converters.

Figure 8:
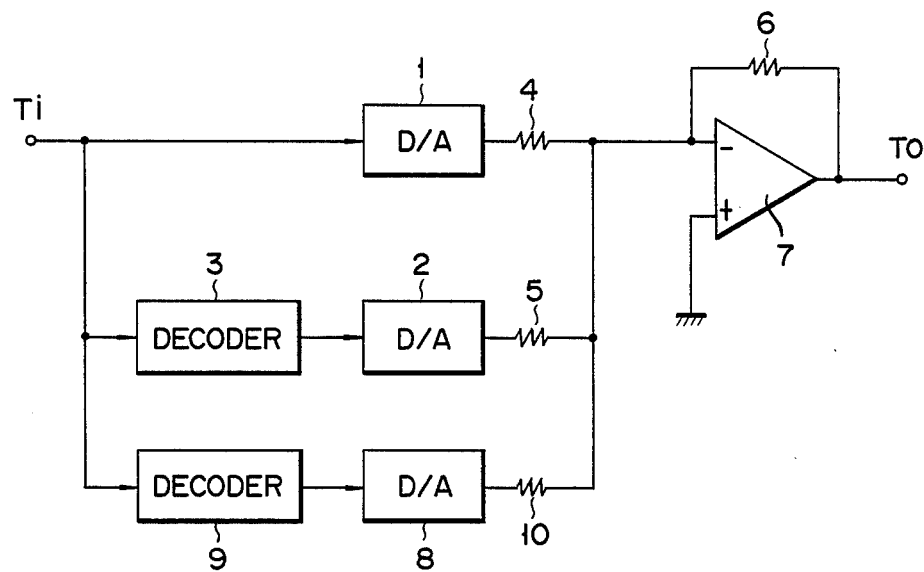
FIG. 8 is a block diagram showing a digital-to-analog conversion circuit according to a second embodiment of this invention.

FIG. 8 shows an arrangement of a digital-to-analog conversion circuit according to a second embodiment of this invention. The digital-to-analog conversion circuit of FIG. 8 is obtained by adding another series circuit of decoder 9, third D/A converter 8 of a bipolar type and resistor 10 to the circuit arrangement of FIG. 4, with the series circuit connected in parallel with the series circuit of decoder 3, second D/A converter 2 and resistor 5 of the digital-to-analog conversion circuit of FIG. 4. In this case, second D/A converter 2 performs the conversion of a plurality of bits containing bits lower in their position than a plurality of bits to be converted by first D/A converter 1, and third D/A converter 8 performs the conversion of a plurality of bits containing bits lower in their position than a plurality of bits to be converted by second D/A converter 1. The conversion characteristic of decoder 3 is determined based on a difference between an output value and an ideal value with second and third D/A converters 2 and 8 and decoders 3 and 9 eliminated from the circuit of FIG. 8. The conversion characteristic of decoder 9 is determined based on a difference between the output value and the ideal value with only third D/A converter 8 and decoder 9 eliminated from the circuit of FIG. 8 and with second decoder 3 and D/A converter 2 operated.

Although in the aforementioned embodiment this invention has been explained in connection with the voltage mode, the same operation can be performed in connection with the current mode. In such an embodiment, it is only necessary to convert the output of the respective D/A converter in current-to-voltage conversion mode so that it may be coupled to a summing amplifier through a proper resistor.

FIG. 9 shows a digital-to-analog conversion circuit according to a third embodiment of this invention, which can automatically calibrate the data conversion characteristic of decoder 3 in FIG. 4. In FIG. 9, the same reference numerals are employed to designate components or elements corresponding to those shown in FIG. 4. At the input side of second D/A converter 2, decoder 20 is inserted, which is of such a type as to update the data conversion characteristic, i.e., to properly update the conversion table data. The D/A conversion circuit further includes switches 21, 22 and 23, counter 24, A/D converter 25 subtracter 26 and calibration controller 27.

For each predetermined time period, or upon a calibration request from an external source, switch 21 for selecting the input of the D/A conversion circuit is changed over to the output side of counter 24 to select the output of counter 24. At the same time, calibration controller 27 turns switch 22 OFF, preventing an output of D/A converter 2 from being supplied to amplifier 7. Calibration controller 27 supplies the output of amplifier 7 to A/D converter 7 when switch 23 is thrown to the A/D converter (25) side. Calibration controller 27 supplies a pulse to counter 24 for every predetermined time period so as to sequentially increment the contents of counter 24. Subtracter 26 finds a difference between the respective count value and the output of A/D converter 25, and this value is written into a conversion table in decoder 20, by controller 27, as a conversion data value for the data corresponding to the respective count value.

After the conversion data corresponding to the respective data value has been written into decoder 20, controller 27 selects the input terminal (Ti) side through the switching of switch 21, causing switch 22 to be turned ON and switch 23 to be thrown to the output terminal (To) side.

Figure 10:
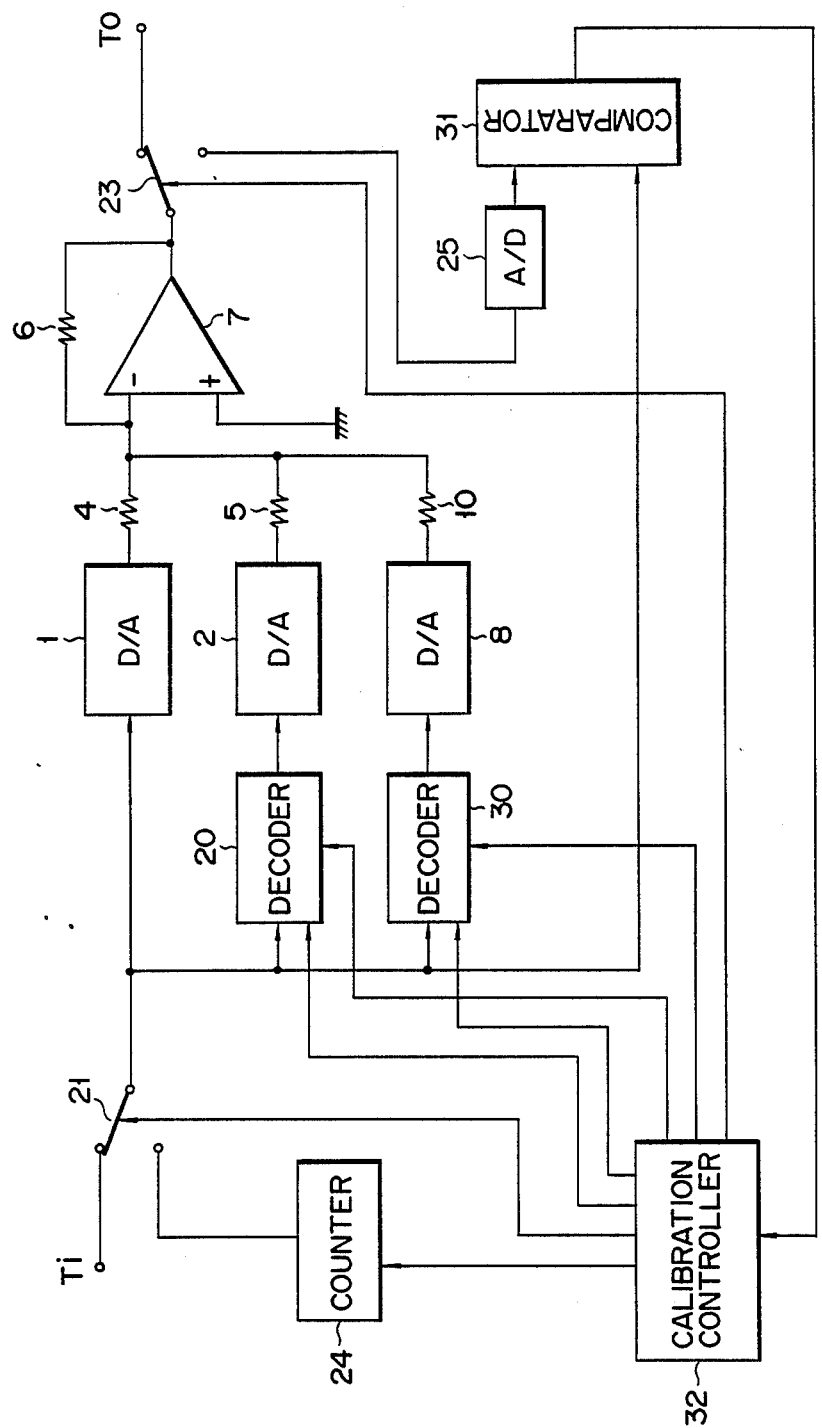
FIG. 10 is a block diagram showing a digital-to-analog conversion circuit according to a fourth embodiment of this invention.

FIG. 10 shows a digital-to-analog conversion circuit according to a fourth embodiment of this invention, which can automatically calibrate the data conversion characteristic of decoders 3 and 9 of FIG. 8. In FIG. 9, the same reference numerals are employed to designated components or elements corresponding to those shown in FIG. 8. At the input side of second D/A converter 2, decoder 20 is inserted which is of such a type as to properly update the data conversion characteristic, i.e., the conversion table data. Switches 21, 23, counter 24 and A/D converter 25 are provided in the digital-to-analog conversion circuit, which are of the same type as those in FIG. 9. Furthermore, at the input side of third D/A converter 8, decoder 30 is inserted which is of such a type as to properly update the data conversion characteristic, i.e., the conversion table data. The D/A conversion circuit further includes comparator 31 and calibration controller 32.

For each predetermined time period, or upon a correction request from an external source, calibration controller 32 throws switch 21 to a counter (24) side to select the output of counter 24. Controller 27 also throws switch 23 to the A/D converter (25) side to supply the output of amplifier 7 to A/D converter 25. Controller 32 provides a pulse for every predetermined time period, causing the count value to be sequentially incremented. The count value is compared by comparator 31 with an output of A/D comparator 25 and the result of comparison is fed to controller 32. Controller 32 updates the contents of the conversion tables of decoders 20 and 30 for every count value and determines the contents of the conversion tables of decoders 20 and 30 so as to make a difference between the inputs of comparator 31 minimal.

After the conversion data corresponding to the respective data value has been written into decoders 20 and 30, controller 32 throws switch 21 to the input terminal (Ti) side to select the input signal of the input terminal Ti and throws switch 23 to an output terminal (To) side.

What is claimed is:

1. A digital-to-analog converting circuit comprising:
   a plurality of digital/analog converting means including an upper bit digital/analog converter for converting a plurality of upper bits of input digital data to an analog signal, and at least one lower-bit digital/analog converter for converting lower bits of the input signal data to an analog signal;
   signal synthesizing means for additively synthesizing respective outputs of said upper-bit and lower-bit digital/analog converters in a predetermined synthesizing ratio determined from a number of said upper bits and lower bits; and
   data converting means, provided at least at one input side of said at least one lower-bit digital/analog converter, for converting the input digital data to multi-bit digital data, and for supplying the multi-bit data to said at least one lower bit digital/analog converter, said multi-bit digital data having fewer bits than said input digital data and corresponding to the plurality of lower bits of input digital data, and said multi-bit digital data comprising components for correcting an error emerging from said upper-bit digital/analog converter.

2. A digital-to-analog conversion circuit according to claim 1, wherein
   said at least one lower-bit digital/analog converter includes a first digital/analog converter for converting, to an analog signal, values of a plurality of bits at least comprising bits lower in their position than said plurality of upper bits of said input digital data, and a second digital/analog converter for converting, to an analog signal, values of a plurality of lower bits at least comprising bits lower in their position than those of said first digital/analog converter;
   said data converting means includes first data converting means for converting the input digital data to multi-bit digital data which corresponds to the plurality of bits converted by said first digital/analog converter and contains components for correcting an error emerging from said upper-bit digital/analog converter, and for supplying the multi-bit digital data to said first digital/analog converter, and second data converting means for converting the input digital data to multi-bit digital data which corresponds to the plurality of bits converted by said second digital/analog converter and contains components for correcting errors emerging from said upper-bit and first digital/analog converts, and
   said signal synthesizing means is provided for additively synthesizing respective outputs of said upper-bit, first and second digital/analog converters in a predetermined synthesizing ratio corresponding to their corresponding bit positions.

3. A digital-to-analog conversion circuit according to claim 1, wherein said data converting means includes means for updating output data corresponding to the input data.

4. A digital-to-analog conversion circuit, comprising:
   a plurality of digital/analog converting means for converting digital values to a corresponding analog signal, said plurality of digital/analog converting means including an upper-bit digital/analog converter for converting a plurality of upper bits of input digital data to an analog signal, and at least one lower-bit digital/analog converter for converting a plurality of lower bits of the input digital data to an analog signal;
   signal synthesizing means for additively synthesizing respective outputs of said upper-bit and lower-bit digital/analog converters in a predetermined synthesizing ratio in accordance with the positions of said plurality of upper bits and lower bits;
   update-enabling data converting means, provided at least one input side of said plurality of digital/analog converting means, for converting the input digital data to multi-bit digital data, and for supplying the multi-bit data to said at least one lower bit digital/analog converter, said multi-bit digital data having fewer bits than said input digital data and corresponding to the plurality of lower bits of input digital data, and said multi-bit digital data containing components for correcting an error emerging from said upper-bit digital/analog converter;
   data generating means for generating input digital data for calibration;
   comparing means for comparing an ideal value with data appearing at the output of said signal synthesizing means upon receipt of the data from said data generating means; and
   data updating means for updating the conversion data of said update-enabling data converting means to be updated based on a result of the comparison made by said comparing means.

5. A digital-to-analog conversion circuit according to claim 4, wherein
   said at least one lower-bit digital/analog converter includes a signal, the values of a plurality of bits at least containing bits lower in their position than said plurality of upper bits of said input digital data, and a second digital/analog converter for converting, to an analog signal, the values of a plurality of lower bits at lest containing bits lower in their position than those of said first digital/analog converter;
   and
   said signal synthesizing means is provided for additively synthesizing respective outputs of said upper-bit, first and second digital/analog converters in a predetermined synthesizing ratio corresponding to their corresponding bit positions.

* * * * *